INVENTOR
W. L. SMITH
BY Leo Stanger
ATTORNEY

FIG. 2
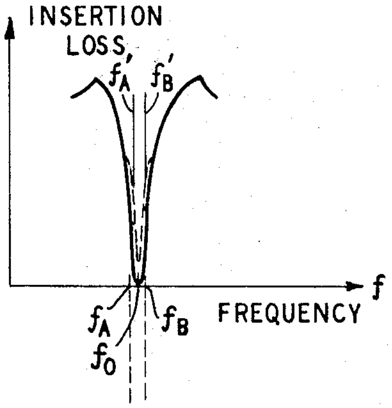
FIG. 3
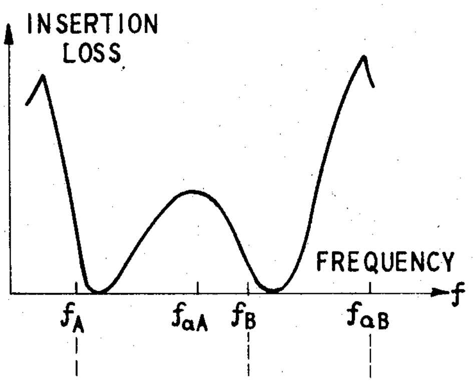
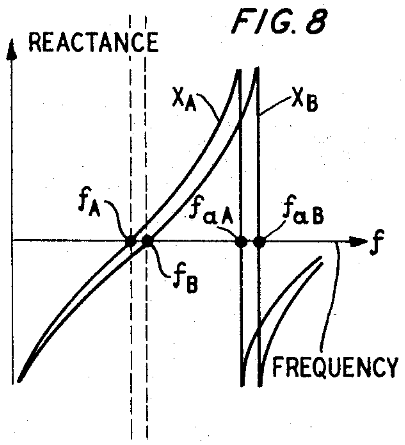
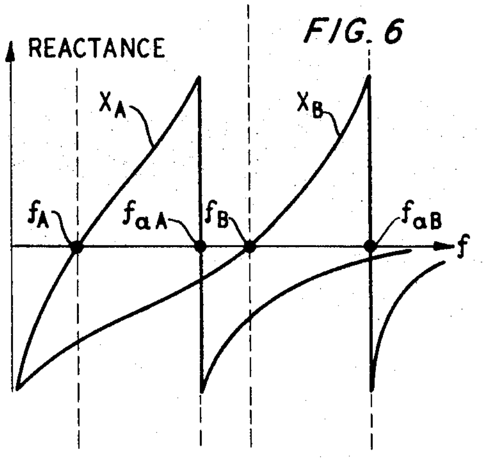
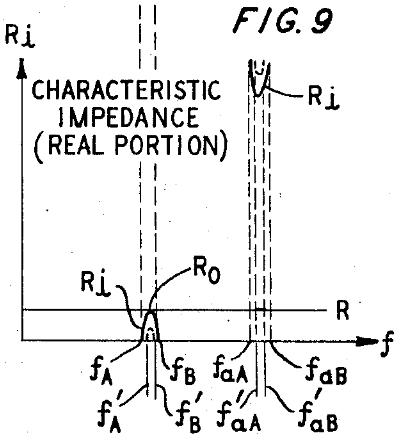
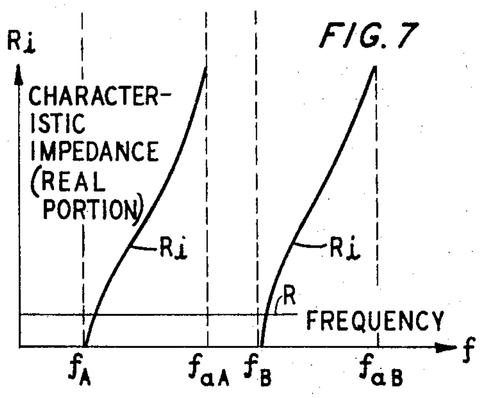

United States Patent Office 3,518,573

Patented June 30, 1970

3,518,573

OSCILLATOR WITH MULTIRESONATOR CRYSTAL FEEDBACK AND LOAD COUPLING

Warren L. Smith, Allentown, Pa., assignor to Bell Telephone Laboratories, Incorporated, Murray Hill, N.J., a corporation of New York Continuation-in-part of application Ser. No. 572,944, Aug. 17, 1966. This application Sept. 3, 1968, Ser. No. 756,909

Int. Cl. H03b *5/36*

U.S. Cl. 331—116 9 Claims

ABSTRACT OF THE DISCLOSURE

The white noise "pedestal" in crystal controlled oscillator circuits is reduced by forming a secondary resonator on the crystal body of a primary resonator that tunes the circuit's oscillator loop, coupling the two resonators through the crystal body, and connecting the secondary resonator to a given load network. The coupling between the resonators is controlled by mass-loading of the crystal body to confine the energy arriving at the load network to one desired frequency band.

REFERENCE TO COPENDING APPLICATION

This is a continuation-in-part of the copending application of W. L. Smith, Ser. No. 572,944 filed Aug. 17, 1966 and now abandoned. The application is based in part on the disclosure in the application of W. D. Beaver and R. A. Sykes, Ser. No. 541,549 filed Apr. 11, 1966, and Ser. No. 558,338 filed June 17, 1966. All these applications are assigned to the assignee of this application and are made a part hereof as if recited herein

BACKGROUND OF THE INVENTION

This invention relates to frequency generating apparatus, and particularly to crystal controlled oscillators.

The inherent stability of crystal controlled oscillators, that is, their ability to generate oscillations within a predetermined narrow frequency band makes them excellent prime frequency generators for such devices as Doppler radar systems and communication systems. However, the noise generated by such oscillators often limits the system performance. This limiting noise becomes significant both inside and outside the predetermined narrow output band when the oscillator's regenerative feedback loop enhances the comparatively insignificant noise, such as "white noise," that first arises in the oscillator amplifier. The enhanced noise may effectively shift the phase of the output signal being regenerated, and hence may alter the output signal. It can also degrade the system's signal-to-noise ratio. Basically, it forms a pedestal, or threshold, beyond which signals that modulate the oscillations must grow for identification.

It is possible to reduce the output noise level of such oscillators by means of narrow band output filters which pass the predetermined oscillator output band and suppress noise outside of this frequency. However, temperature variations cause the frequencies of both the crystal controlled oscillator and the narrow band filter to drift. While the drifts alone may be within acceptable limits, they may occur at different rates. Thus, filter bandwidths must be sufficiently wide always to embrace these temperature induced frequency drifts on the part of the crystal structure. The filter might otherwise suppress portions of the predetermined output band. Such wideband filters allow much undesirable noise near the sidebands to persist. The filter also adds a number of additional components to already complex systems.

THE INVENTION

According to the invention, these deficiencies of crystal controlled oscillator circuits are obviated by forming a secondary resonator in the crystal body of the primary resonator that tunes the circuit's oscillator loop, and, while connecting the secondary resonator to a given load, increasing the masses and increasing the spacing of the electrodes used to form the resonators to reduce the coupling between resonators below a given maximum. In this way the coupling is such as to impedance-match the resonator to the load within one narrow frequency band. Preferably the coupling between the resonators is controlled by mass loading and spacing of the resonator electrodes to just less than critical for the load network.

Feeding of the energy out of the loop through the resonators according to the invention suppresses noise near the sidebands. The resonators' sharing a common crystal body avoids frequency drifts of one relative to the other in response to temperature changes.

The mass loading and spacing of the electrodes prevents the output passband from widening as a result of the presence of a second resonator on the tuning circuit.

These and other features of the invention are pointed out in the claims. Other objects and advantages of the invention will be understood from the following detailed description when read in light of the accompanying drawings.

BRIEF DESCRIPTION OF THE DRAWINGS

FIG. 2 is a graph illustrating the transmission characteristic of the crystal structure of FIG. 1 when its resonators are coupled loosely enough by means of a mass-loading and spacing for operation in the environment of FIG. 1;

FIG. 3 is a graph illustrating the transmission characteristics of crystal structures such as those of FIG. 1 when the resonators are coupled too tightly for operation in the environment of FIG. 1;

FIG. 6 is a graph illustrating the variations in reactance for the impedance networks of FIG. 4 so as to illustrate the operation of the crystal structure in FIG. 1 when the resonators are too tightly coupled for operation in FIG. 1;

FIG. 7 is a diagram illustrating the real portion of the characteristic impedance as a function of frequency of the circuit of FIG. 5 and the crystal structure of FIG. 1 when the resonators are coupled too tightly for operation in the embodiment of FIG. 1;

FIG. 8 is a graph illustrating the reactance variations as a function of frequency for the impedances in FIG. 4 when the crystal structure of FIG. 1 is mass-loaded and the resonators loosely coupled below a given maximum for operation in the environment of FIG. 1;

FIG. 9 is a diagram illustrating the real portion of the characteristic impedance, i.e. image impedance, of the structure in FIG. 4 and the crystal structure of FIG. 1 as a function of frequency when the resonators are loosely coupled below a given maximum for operation in the environment of FIG. 1;

DESCRIPTION OF PREFERRED EMBODIMENT

Figure 1:
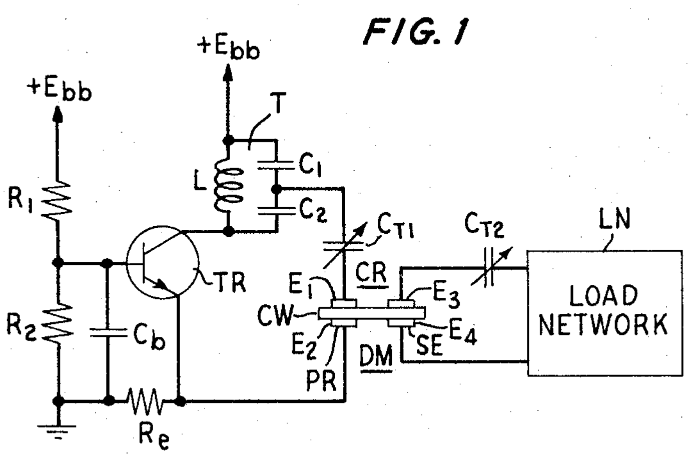
FIG. 1 is a schematic diagram of an oscillating circuit embodying features of the invention.

In FIG. 1 a voltage divider composed of resistors $R_1$ and $R_2$ and connected to a positive source $E_{BB}$ biases the base of a common-base-connected NPN transistor TR that constitutes the active element in the oscillator according to the invention. A bypass capacitor $C_b$ furnishes an alternating-current path from base to ground. An emitter resistor $R_e$ biases the emitter for amplification. The output of transistor TR at the collector passes through a tank circuit T composed of capacitors $C_1$, $C_2$ and inductor L. The ratio of impedances in capacitors $C_1$ and $C_2$ matches the output impedance of the transistor TR to the image impedance of a primary resonator PR in a crystal structure CR. The latter lies in the feedback path to the emitter of transistor TR, which operates as a common-base amplifier. The tank circuit T also behaves as a coarse tuner which selects for operation one of the many frequency modes in which the crystal structure CR can operate. The crystal structure CR feeds back to the emitter only the signals in its operating mode. The latter reamplifies the signal. The current transforming action of the tank circuit T again passes those signals at the frequency of the operating mode in the crystal structure CR back to the transistor emitter for continuous circulation around the oscillating loop. A trimming capacitor $C_{T1}$ slightly tunes a primary resonator PR of the crystal structure CR.

In ordinary oscillators the noise arising in the transistor TR, although filtered to some extent by the tank circuit T and the crystal structure CR would pass or would be coupled out of the oscillator loop together with the signal. Such coupling usually is done with a secondary winding on the coil L. However, according to the invention, the crystal structure CR forms with its crystal body a highly selective secondary resonator SE coupled to the primary resonator PR. The energy circulating in the oscillator loop is coupled from the primary resonator PR through the secondary resonator SE to a load network LN. The highly selective secondary resonator SE when thus coupled with the resonator PR forms a highly selective monolithic filter which suppresses noise outside the operating band, as energy passes from the oscillating loop. A trimmer capacitor $C_{T2}$ in series with the secondary resonator SE tunes the secondary resonator to the same frequency that the trimmer capacitor $C_{T1}$ would tune the primary resonator PR if the resonators were uncoupled. The trimmer capacitors $C_{T1}$ and $C_{T2}$ form with the crystal structure a dual mode resonator DM.

The crystal structure of FIG. 1 is composed of a crystal wafer CW having vapor deposited thereon, two electrodes $E_1$ and $E_2$ to form the primary resonator PR, and electrodes $E_3$ and $E_4$ to form the secondary resonator SE. When excited near the thickness shear mode fundamental frequency, or an overtone thereof, the electrodes $E_1$ and $E_2$ cause the wafer CW to vibrate in the thickness shear mode. The vibrating wafer piezoelectrically causes electrical signals in the electrodes $E_3$ and $E_4$. These are applied to the load network LN. The resonators are each constructed to tune to the same frequency in the uncoupled state.

The masses of the electrodes $E_1$, $E_2$ and $E_3$, $E_4$ and spacing between the pairs of electrodes are sufficiently great to be in what is called herein "definitively" coupled relation and preferably to be less than "critically" coupled. This definitively coupled relation is defined by the two pairs of electrodes $E_1$, $E_2$ and $E_3$, $E_4$ being sufficiently massive and spaced sufficiently far apart so that the coupling between them is such that the frequency difference between the resonances $f_A$ and $f_B$ exhibited by the coupled resonators PR and SE is less than the smallest frequency difference between either the antiresonance $f_{aA}$ and resonance $f_A$ of the resonator PR or between the antiresponance $f_{aB}$ and antiresonance $f_B$ of SE. That means that $$f_B - f_A < f_{aA} - f_A$$

and $f_B - f_A < f_{aB} - f_B$.

In the preferred embodiment of FIG. 1, the effect is accentuated so that the pairs of electrodes $E_1$, $E_2$ and $E_3$, $E_4$ are coupled less than one-third of the maximum definitive coupling. That is to say $f_B - f_A < (f_{aA} - f_A)/3$, or $f_B - f_A < (f_{aB} - f_B)/3$. The electrodes $E_1$, $E_2$ and $E_3$, $E_4$ are then sufficiently massive and spaced far enough apart so that the coupling between them is such that the coupling bandwidth (i.e., the resonant-to-resonant difference $f_B - f_A$) is less than one-third of the smallest resonant-to-antiresonant range of one of the two resonators.

In the oscillator of FIG. 1, the crystal structure CR with resonators PR and SE in definitely coupled condition exhibits a transmission characteristic such as shown in FIG. 2. Thus, the oscillator feeds out and feeds back energy only along a narrow band. The structure CR, if its resonators were tightly coupled as a result of its electrodes having insignificant masses, would exhibit the transmission characteristic illustrated in FIG. 3. An oscillator with the structure CR creating the characteristic of FIG. 3 feeds out a bandwidth that is at least as wide as one resonant-to-antiresonant range $f_{aA} - f_A$ or $f_{aB} - f_B$ of the crystal structure.

The coupling between the resonators PR and SE, that is, the extent to which the vibrations in the wafer CW between the electrodes $E_1$ and $E_2$ appear in the wafer between electrodes $E_3$ and $E_4$, thus serves to confine the band along which oscillator signals and their accompanying noise signals are emitted to a given narrow band. The coupling depends upon the masses of the electrodes and the distances between the resonators. The electrode masses, when sufficiently high, are significant in that they tend to concentrate the vibrating energy in the portion of the wafer CW that lies between them. under these circumstances the amplitude of the wafer vibrations outside the unelectrode area decreases exponentially. Little energy reaches the boundaries of the wafer CW. By spacing the resonators PR and SE matching any degree electrode mass-loading or by mass-loading the electrodes to correspond with any spacing, a predetermined degree of coupling between resonators can be established to obtain a desired output band. Structures of this type are discussed in the copending applications of W. D. Beaver and R. A. Sykes, Ser. No. 541,549 filed Apr. 11, 1966 and Ser. No. 558,338 filed June 17, 1966.

Such structures make use of the fact that the masses of the electrodes also lower the resonant frequency of each resonator from the resonant frequency of the unelectrode wafer. The fractional or percentage decrease in frequency from the unelectroded condition to the massively electroded condition of the resonant frequency of each resonator, when undisturbed by other resonators, is called the plateback. Plateback constitutes a means for measuring the mass loading.

Figure 4:
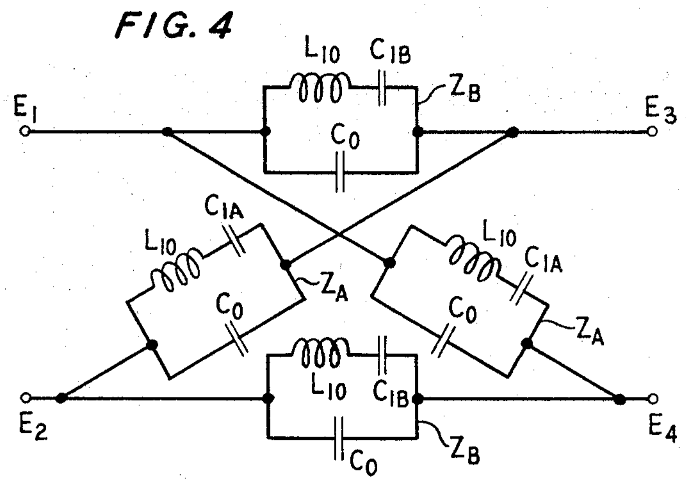
FIG. 4 is a schematic diagram illustrating the equivalent circuit for the crystal structure in FIG. 1 in the form of a lattice structure.
Figure 5:
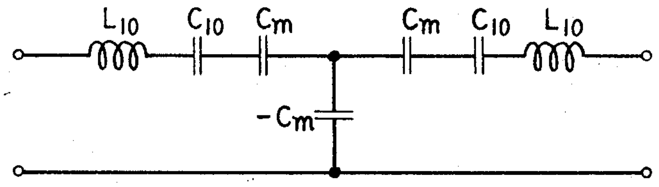
FIG. 5 is a schematic diagram illustrating a so-called ladder equivalent circuit for the crystal structure of FIG. 1.

The difference in the oscillator operation resulting in the changeover from the ordinary to the "definitively" coupled relation can be explained by considering the equivalent electrical networks of FIGS. 4 and 5 for the crystal structure CR of FIG. 1 and the corresponding transmission characteristics. FIG. 4 is the lattice equivalent network. FIG. 5 is the ladder equivalent network. In the ladder equivalent circuit of FIG. 5, the three capacitors $C_m$ represent the electrical equivalent of the acoustical coupling between the electrodes $E_1$, $E_2$ and $E_3$, $F_4$. The two circuits are related to each other by the following equations:

$$C_{1B} = \frac{C_{10}}{1 + \frac{C_{10}}{C_m}} \qquad (1)$$

$$C_{1A}+\frac{C_{10}}{1-\frac{C_{10}}{C_m}} \qquad (2)$$

The values $C_{10}$ and $L_{10}$ are such that a shear mode fundamental frequency equals $$1/2\pi\sqrt{L_{10}C_{10}}$$

The value of $L_{10}$ itself is a function of the crystal body thickness and the geometry of the electrodes $E_1$, $E_2$ and $E_3$, $E_4$. $C_0$ is the capacitance of one pair.

The lattice equivalent circuit is the easier one to analyze. Here, in FIG. 4 when the oscillator supplies energy to the electrodes $E_1$ and $E_2$ near or at the shear mode fundamental frequency, the circuit behaves as if composed of two pairs of resonant impedances $Z_A$ and $Z_B$. These impedances are useful for determining the value of the characteristic impedance, i.e., image impedance, $Z_i$ which for the lattice structure of FIG. 4 is equal to $\sqrt{Z_AZ_B}$. Since the crystal structure CR has a large Q, the values of the impedances $Z_A$ and $Z_B$ are almost exclusively comprised of their reactances $X_A$ and $X_B$. Thus, $Z_i$ equals $\sqrt{X_AX_B}$.

In crystal structures which are not mass-loaded, that is the electrode masses are insignificant, and the source S excites the entire crystal body, the individual reactances $X_A$ and $X_B$ of impedances $Z_A$ and $Z_B$ vary with the frequency as shown in FIG. 6. The reactance $X_A$ varies from a low negative value through zero at the lower resonant frequency $f_A$. The reactance $X_A$ continues to a high positive value. At the frequency $f_{aA}$ the reactance changes from a high positive inductive value to a high negative capacitive value. This is the antiresonant frequency $f_{aA}$. As the frequency increases, the prevailing capacitive reactance diminishes to zero. The reactance $X_B$ follows a similar curve with the resonant frequency $f_B$ and the antiresonant frequency $f_{aB}$.

Since $X_A$ and $X_B$ are imaginary numbers, that is they are equal to $jX_A'$ and $jX_B'$, their product is negative if they carry a like sign; but positive if they bear opposite signs. The square root of a positive number is real. Thus, in the frequency regions in which $X_A$ and $X_B$ appear on opposite sides of the abscissa, the structure CR exhibits real positive characteristic impedances $R_i$.

As shown for the curves of FIG. 7, two real positive characteristic impedances $R_i$ exist. They extend respectively across the lower resonant-to-antiresonant range $f_A$ to $f_{aA}$ and the upper resonant-to-antiresonant range $f_B$ to $f_{aB}$. They affect the insertion loss exhibited by such structures. Such insertion loss is minimum when the terminating impedance matches the characteristic impedance. The greater the mismatch, the greater the insertion loss. Since the load network LN is resistive, the insertion loss for the structure CR is high in the reactive impedance region $f_{aA}$ to $f_B$. The insertion loss is low at the two frequencies at which the horizontal line representing any one load resistance such as R in FIG. 7 crosses the characteristic impedance curves. For low load resistances the structure CR produces the insertion loss shown in FIG. 3.

Giving the electrodes of the plates $E_1$, $E_2$, $E_3$, and $E_4$ sufficient mass concentrates the shear energy in the wafer CW between the electrodes of the respective resonator PR and SE so that the crystal wafer CW vibrates with greatly diminishing amplitude outside the area between the electrodes. No significant energy is permitted to reach the boundaries of the wafer CW. The resonators PR and SE, because they are in each other's effective field, operate similar to a tuned transformer. Controlling their distances and the mass of the electrode pairs regulates the band or spectrum through which the energy of the system of the electrodes $E_1$ and $E_2$ passes to the system of the electrodes $E_3$ and $E_4$. This is the equivalent of controlling the coupling represented by capacitors $C_m$.

As is seen from FIG. 4, reducing the coupling between the electroded regions increases the value of $C_m$. As a result the ratios $C_{10}/C_m$ decreases in the equations for the values $C_{1B}$ and $C_{1A}$. This increases the denominator for $C_{1A}$ and decreases the denominator for $C_{1B}$. As a result, the value of $C_{1A}$ decreases and the value of $C_{1B}$ increases. Thus, the resonant frequencies $f_A$ and $f_B$ approach each other. In one embodiment of the invention, they are made close enough to appear as shown in FIG. 8. Here, the two separate reactances $X_A$ and $X_B$ of impedances $Z_A$ and $Z_B$ follow paths similar to that in FIG. 6. However, the mass-loading and separation make the resonant-to-antiresonant ranges overlap. Now, the resonant frequency $f_B$ in the curve $X_B$ falls between the resonant frequency $f_A$ and the antiresonant frequency $f_{aA}$. The resulting real impedances $Z_i$, that is $R_i$, appear in the real plane of FIG. 9. As shown in FIG. 9, the impedance $Z_i$ possesses two positive real ranges. On range extends between $f_A$ and $f_B$. $R_i$ starts at a value of zero, rises to a maximum value $R_o$ and returns to zero in a frequency band between $f_A$ and $f_B$. In a frequency band between $f_{aA}$ and $f_{aB}$ the resistance value of the image impedance varies from infinity to a minimum $R_m$ and back to infinity. As the coupling between the resonators is decreased, the impedances change to those shown by the dotted lines in the bands $f_A'$ to $f_B'$ and $f_{aA}'$ to $f_{aB}'$. If the coupling is small enough, the difference in impedance value between the intermediate maximum $R_o$ of one band and the intermediate minimum $R_m$ in the other band is several orders of magnitude. When uncoupled the resonators each tune to a frequency $f_o$ between $f_A$ and $f_B$.

When the maximum impedance $R_o$ at the intermediate point of one of these ranges is made equal to the resistance R of the load network LN, either by varying the mass loading or spacing, the coupling is said to be critical. Thus at critical coupling when the value R of the load network LN is equal to the peak $R_o$ between frequencies $f_A$ and $f_B$, the insertion loss appears as shown by the solid line in FIG. 2. The characteristic impedances of the band between frequencies $f_A$ and $f_B$ hardly affect the result because they are so remote from the value R. They and the value R are greatly mismatched. Their effects are thus substantially excluded.

According to a preferred embodiment of the invention, the coupling is less than critical. Less than critical coupling means that the intermediate maximum impedance $R_o$ has been made slightly less than the impedance R of the load network LN. The real portions of the characteristic impedances then lie in the narrower band between frequencies $f_1'$ and $f_2'$. Thus, by increasing the masses of electrodes $E_1$, $E_2$, $E_3$, $E_4$, and increasing the spacing between electrodes $E_1$, $E_2$ and $E_3$, $E_4$, the coupling between resonators can be reduced. By reducing the coupling until the fixed value R lies above the peak $R_o$ between the frequencies $f_A$ and $f_B$, but still remote from the impedances between frequencies $f_{aA}$ and $f_{aB}$, the insertion loss curve can be changed by mismatching and adjusting to exhibit any narrow band. At the same time the wide passband shown in FIG. 3 is eliminated.

According to the invention, this band is made to correspond to the predetermined narrow output band for suppressing the noise outside of the predetermined output band frequency. The trimmer capacitors $C_{T1}$ and $C_{T2}$ adjust the precise frequencies of the resonant circuits. They serve to help compensate for the residual frequency inaccuracies in manufacture of the resonators PR and SE.

By virtue of the invention, the band spectrum of energy coupled out of the oscillator loop is identical to the band spectrum fed back. This suppresses the noise at the sidebands which might otherwise distort the output. The resonators' sharing a common crystal body avoids frequency drifts of the oscillator tuning relative to the filter tuning in response to temperature changes. The electrodes being mass loaded and spaced limits the oscillator output to a desired narrow frequency range without the need of suppressing portions of the band introduced by the secondary resonator SE.

In essence, current circulates regeneratively from the transistor TR to the transformer T, the dual mode resonator DM and back to the transistor. The transformer T constitutes a coarse tuning for the oscillator action and also, by virtue of capacitors $C_1$ and $C_2$, serves as an impedance matching device between the output of the transistor TR and the input of the dual mode resonator DM. The dual mode resonator serves as a fine tuning for the oscillator and also serves as its output path and output filter.

Noises outside of the tuning band due to the behavior of transistor TR are filtered out by the dual mode resonator DM. Signals appearing at the secondary resonator SE substantially suppress and filter out noises or other signals outside of the filter passband. According to the invention, filter passbands can be made quite narrow, limited only by realizable resonator Q factors, because temperature changes affect both the primary and secondary resonators equally.

Exemplary values of the intermediate maximum characteristic resistance $R_o$ have been found in the fundamental thickness shear mode from the formula $$R_o=2\pi BwL=2\pi\frac{Bw}{f_o}50\times10^6\frac{t^2}{r^2}$$

where $Bw$ is the bandwidth $f_B-f_A$, $f_o$ is the midband frequency, $t$ is the crystal wafer thickness, $r$ is the length of one electrode transverse to the space between the electrode pairs, and L is the inductance of one resonator. Thus a value of $R_o$ can be established by choosing values of $Bw$, $t$ and $r$.

Figure 10:
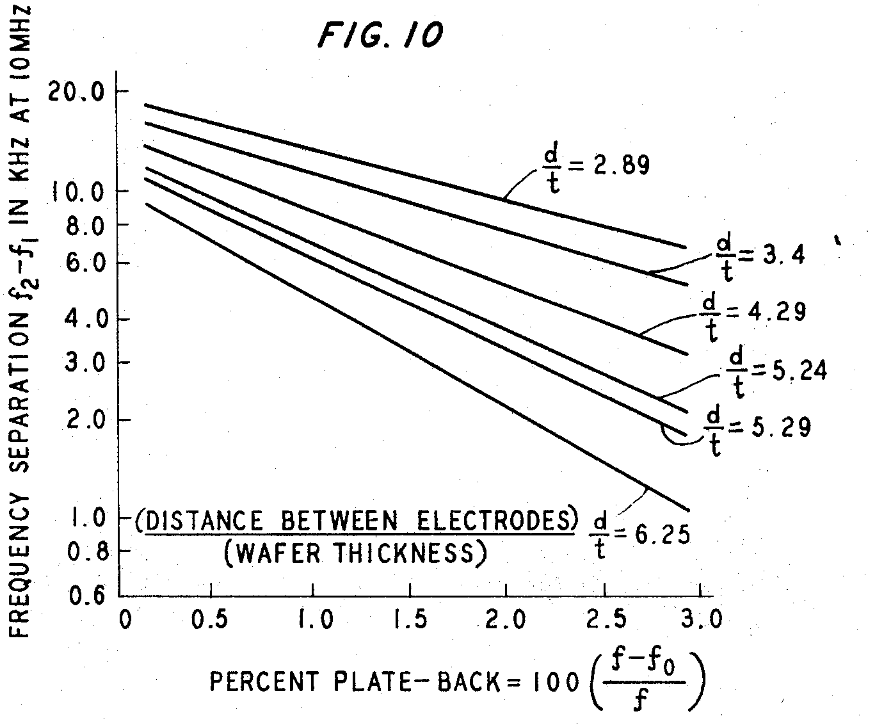
FIGS. 10, 11, and 12 are graphs illustrating the effects on bandwidth, of plateback, crystal wafer thickness, and electrode separation useful for the purpose of constructing the crystal structure of FIG. 1.
Figure 11:
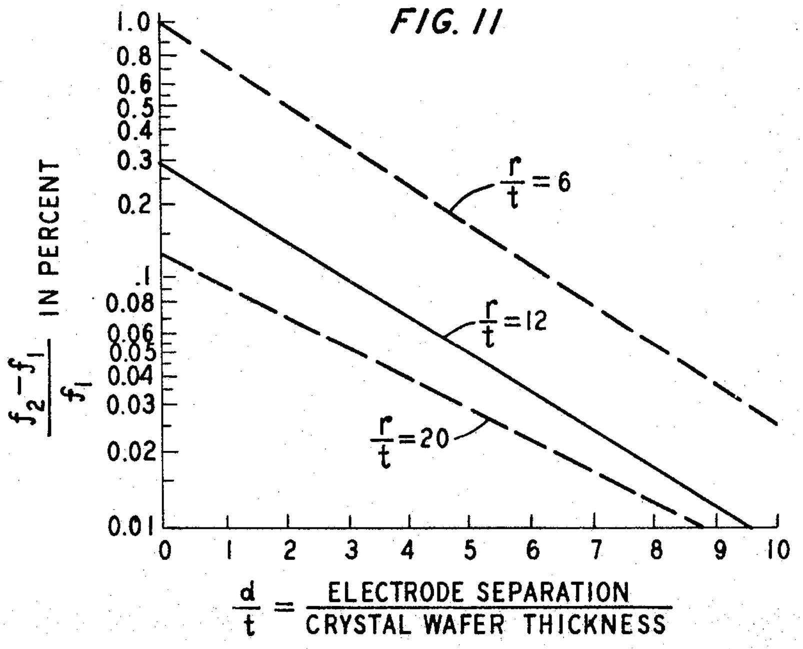
Figure 12:
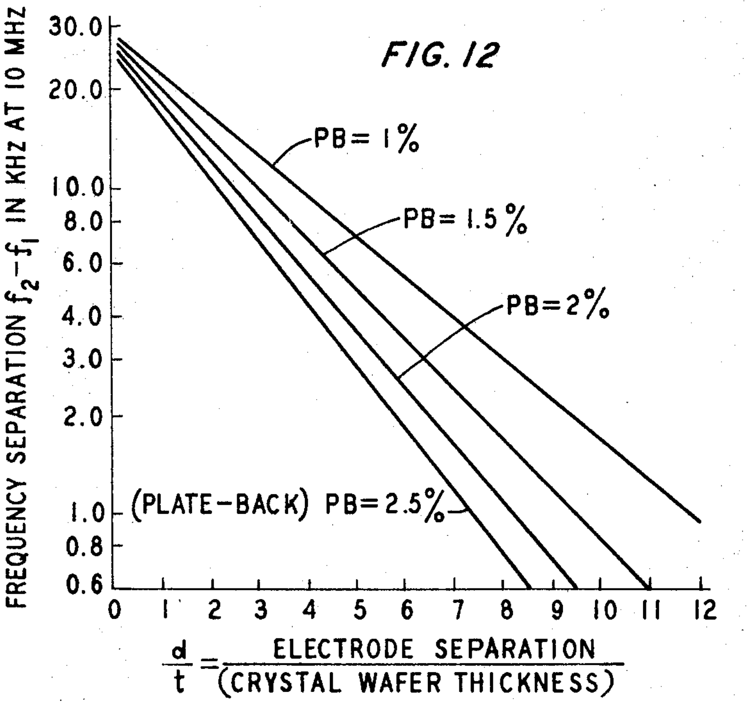

Examples of curves for a structure such as CR operating in the fundamental thickness shear mode and useful for constructing the crystal structure of FIG. 1 are shown in FIGS. 10, 11 and 12.

In one embodiment of the invention the components have the following values. Here the tank circuit T tunes the structure CR to the third overtone mode of the fundamental thickness shear mode.

$R_1$=10K
$R_2$=3K
TR=2N918
$C_b$=.001 $\mu$f.
$R_e$=1K
$C_1$=20 pf.
$C_2$=80 pf.
L=1.2 $\mu$H
Plateback=2.5%
CW thickness=.005″
Electrode dimensions=.080″ x .090″
Distance between electrodes=.025″
LN=100Ω
$f_o$=35 mHz. on third overtone
CW material is AT cut quartz
Electrodes aligned in Z′ crystallographic direction.

Figure 13:
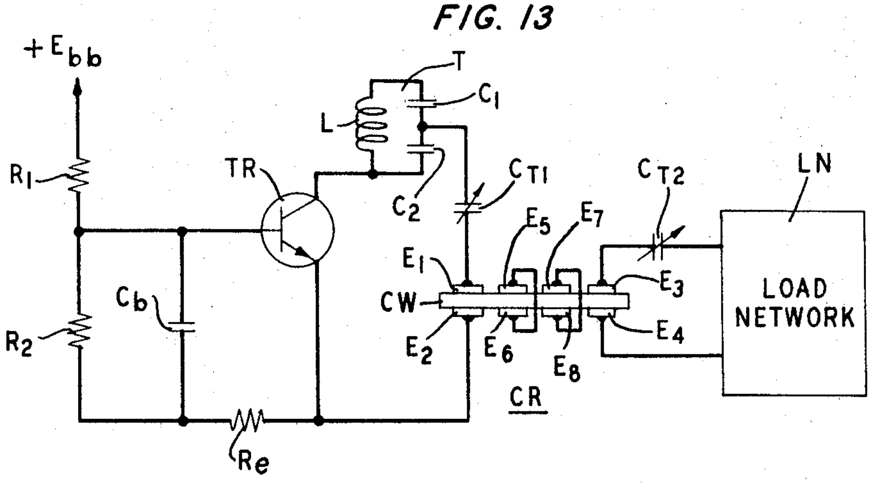
FIG. 13 is a schematic diagram of another oscillator circuit also embodying features of the invention.

The oscillator circuit of FIG. 13 corresponds to that of FIG. 1. However, in this embodiment of the invention, the sidebands of the oscillator output are rendered steeper by interposing between the electrodes $E_1$ and $E_2$ and $E_3$ and $E_4$ two pairs of electrodes $E_5$, $E_6$ and $E_7$, $E_8$. These are aligned between the electrodes $E_1$, $E_2$ and $E_3$, $E_4$. They form additional resonators. Each resonator has its electrode mass-loading and spacing from the adjacent resonator so as to be in "definitively" coupled relation with the adjacent electrodes.

Preferably, the relation is such that as between any two adjacent resonators disregarding the others $f_B-f_A$ is less than $(f_{aA}-f_A)/3$. Preferably also, the maximum real characteristic impedance $R_o$ exhibited in the range between $f_A$ and $f_B$ is slightly less than the resistance of the load network, but far closer to this resistance than the minimum resistance between $f_{aB}$ and $f_{aA}$.

This coupling can be ascertained as between any two resonators by applying a variable-frequency voltage across one resonator and short-circuiting the adjacent resonator while open-circuiting or inductively detuning the remaining resonators. The frequencies at which the voltage across the input electrodes are minimum as a result of maximum currents through the source impedance in the vicinity of the thickness shear mode being used, constitute the frequencies $f_A$ and $f_B$ for these two adjacent resonators.

The frequency $f_{aA}$ or $f_{aB}$ may be determined by applying a variable high-impedance frequency source across one electrode pair and detuning the others. The frequency at which a maximum voltage occurs is the antiresonant frequency of the resonator being tested.

The term thickness shear mode is used herein as defined in the McGraw-Hill Encyclopedia of Science and Technology, 1966, vol. 10, p. 221 et seq. It includes both the parallel face motion and the circular face motion about a common axis. The latter is sometimes called the thickness twist mode.

While embodiments of the inventions have been described in detail, it will be obvious to those skilled in the art that the invention may be practiced otherwise within its spirit and scope.

What is claimed is:

1. An oscillator comprising amplifier means having an output and an input, feedback means from the output of the amplifier means to the input of the amplifier means for forming a signal loop, crystal tuning means in said feedback means, said crystal tuning means having a crystal body cut for operation in a thickness shear mode and first and second acoustically-coupled resonator means formed with said crystal body, said feedback means coupling said crystal tuning means between said input of said amplifier means and said output of said amplifier means for exciting said body in the thickness shear mode, and energy transfer means coupled to said crystal tuning means for coupling energy out of said loop through said body to load means, said energy transfer means forming with said crystal tuning means a circuit having a lattice equivalent circuit with a line impedance and a diagonal impedance, said line impedance and said diagonal impedance having resonant and antiresonant frequencies, said resonator means being spaced from each other and having sufficient plateback so that two of the antiresonant frequencies are higher than the highest resonant frequencies, said resonator means also having platebacks and spacings such that the energy coupled out of the loop conforms to a given frequency band.

2. An oscillator as in claim 1 wherein the plateback of said resonator means are such that the difference between said highest and lowest resonant frequencies is less than one-third the difference between the resonant and antiresonant frequencies exhibited by the one of said impedances.

3. An oscillator as in claim 1 or 2 wherein said resonator means have platebacks such that said resonator means are coupled through the crystal body such that said crystal tuning means exhibit a maximum characteristic impedance between said resonant frequencies that is less than the resistance of the load means whereby said resonator means are tuned less than critically relative to the impedance of the load network.

4. An oscillator as in claim 1 wherein said resonator means each include electrodes, said electrodes of said first resonator means being connected in said feedback means to the said input and said output of said amplifier means and said electrodes of said second reasonator means being connected to said load network.

5. An oscillator as in claim 1, 2 or 4 wherein both of said resonator means exhibiting antiresonant frequencies and said resonator means have masses and spacings such that the difference between the resonant frequencies are less than the difference between the resonant frequency and antiresonant frequency of either of said resonator means.

6. An oscillator as in claim 1 wherein said resonators have masses and spacings such that said crystal tuning means exhibit a characteristic impedance range having an intermediate maximum between the resonant frequencies and an intermediate minimum between said antiresonant frequencies, and wherein said intermediate minimum exceeds said intermediate maximum by an order of magnitude.

7. An oscillator as in claim 1 wherein said feedback means include impedance transformer means between the output of said amplifier means and said crystal tuning means.

8. An oscillator as in claim 1 wherein a tank circuit having an inductor in parallel with two series capacitors is coupled by its inductor to said amplifier and coupled to said crystal tuning means at the point between said capacitors to step down the impedance from said amplifier means.

9. An oscillator as in claim 1 further comprising additional resonator means formed with said body in said crystal tuning means.

References Cited

UNITED STATES PATENTS

| | | | |
|---|---|---|---|
| 1,450,246 | 4/1923 | Cady | 333—72 X |
| 2,313,850 | 3/1943 | Usselman | 331—163 X |
| 3,384,768 | 5/1968 | Shockley et al. | 331—155 X |

OTHER REFERENCES

Hilling, "An 85 Mc./s. Transistorized Transmitter," Electronic Engineering, July 1964, p. 468.

ROY LAKE, Primary Examiner

S. H. GRIMM, Assistant Examiner

U.S. Cl. X.R.

310—9.8; 331—155, 163; 333—72